(12) United States Patent
Miller et al.

(10) Patent No.: US 7,201,784 B2
(45) Date of Patent: Apr. 10, 2007

(54) SURFACTANT SLURRY ADDITIVES TO IMPROVE EROSION, DISHING, AND DEFECTS DURING CHEMICAL MECHANICAL POLISHING OF COPPER DAMASCENE WITH LOW K DIELECTRICS

(75) Inventors: Anne E. Miller, Portland, OR (US); Charles Poutasse, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 10/611,233

(22) Filed: Jun. 30, 2003

(65) Prior Publication Data

US 2004/0266183 A1    Dec. 30, 2004

(51) Int. Cl.
*C09G 1/02* (2006.01)
*C09G 1/04* (2006.01)
*B24B 1/00* (2006.01)

(52) U.S. Cl. .......................... 51/308; 106/3; 438/692; 438/693

(58) Field of Classification Search .................. 51/307, 51/308, 309; 106/3; 438/692, 693
See application file for complete search history.

(56) References Cited

U.S. PATENT DOCUMENTS

| | | | |
|---|---|---|---|
| 6,143,707 A * | 11/2000 | Trinh et al. | 510/220 |
| 6,413,869 B1 * | 7/2002 | Achuthan et al. | 438/690 |
| 6,498,134 B1 * | 12/2002 | Scheibel et al. | 510/357 |
| 2001/0008828 A1 * | 7/2001 | Uchikura et al. | 451/41 |
| 2002/0039982 A1 * | 4/2002 | Foley et al. | 510/218 |
| 2002/0093002 A1 * | 7/2002 | Tsuchiya et al. | 252/79.1 |
| 2002/0177318 A1 * | 11/2002 | Miller | 438/689 |
| 2003/0178320 A1 * | 9/2003 | Liu et al. | 205/640 |
| 2004/0147118 A1 * | 7/2004 | Liu et al. | 438/689 |

OTHER PUBLICATIONS

Cook, Chemical Processes in Glass Polishing, Journal of Non-Crystalline Solids 120, (1990) pp. 182-171, Galileo Electro-Optics Corp.
Miller, et al., Chemically Induced Defects During Copper Polish, Abstract, Intel Corporation, Hillsboro OR, USA, 5 pages total.
Unknown, Aldrich, Handbook of Fine Chemicals and Laboratory Equipment, Index of documents, Glycine, 2003-2004, total pp. 4.

(Continued)

*Primary Examiner*—Michael Marcheschi
(74) *Attorney, Agent, or Firm*—Blakely, Sokoloff, Taylor & Zafman LLP

(57) ABSTRACT

Slurries and methods for the chemical mechanical polishing of high density copper interconnects in a low k ILD are presented. In a particular embodiment of the present invention, a slurry for polishing copper is formed by combining a surfactant comprising an alkyl ethoxy organic acid such as glycolic acid ethoxylate lauryl ether (GAELE), an abrasive such as silica, an oxidizing agent such as hydrogen peroxide, and a chelating buffer system such as citric acid and potassium citrate dissolved in the mixture. This slurry provides a very low incidence of bent line defects, a low erosion rate, and a low dishing rate on a substrate comprising high density copper interconnects in a low k ILD. Embodiments of methods of the present invention use the disclosed slurries.

13 Claims, 17 Drawing Sheets

OTHER PUBLICATIONS

Ramarajan, et al., Effect of pH and Ionic Strength on Chemical Mechanical Polishing of Tantalum, Electrochemical and Solid-State Letters, pp. 232-234 (2000).

Porter, et al., Handbook of Surfactants, second edition, pp. 98-168, (1994).

Edwards, et al., Inorganic Anions and Copper Pitting, Corrosion Science, May 1994, NACE International, pp. 366-372.

* cited by examiner

SURFACTANT SLURRY ADDITIVES TO IMPROVE EROSION, DISHING, AND DEFECTS DURING CHEMICAL MECHANICAL POLISHING OF COPPER DAMASCENE WITH LOW K DIELECTRICS

BACKGROUND OF THE INVENTION

1. Field of the Invention

Embodiments of the invention relate generally to the field of chemical mechanical polishing (CMP), and more specifically, to methods and chemistries to improve erosion, dishing, and bent line defects during the CMP of copper damascene structures having low k dielectrics.

2. Discussion of Related Art

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum based interconnects with copper based interconnects provides, depending on the dimensions chosen, reduced resistance, reduced capacitance, or both. The use of copper interconnects also provides greater immunity to electromigration. For all these reasons, manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore copper diffusion barriers must be used to isolate copper metal from those transistor areas. Additionally, unlike aluminum based metal interconnect systems which are formed by subtractive etch processes, copper interconnects are typically formed by damascene metal processes. Such processes are also sometimes referred to as inlaid metal processes. In a damascene process, trenches are formed in a first layer, and a metal layer is formed over the first layer including the trenches. Excess metal is then polished off, leaving individual interconnect lines in the trenches. Typically, a manufacturer of integrated circuits will use a dual damascene process where trenches and vias are formed in one process and both the vias and trenches are filled with copper simultaneously. The removal of excess copper is typically accomplished by chemical mechanical polishing (CMP). Although there are many known variations of the damascene method of metallization, the most common method for removing the excess copper is by CMP.

DETAILED DESCRIPTION OF THE PRESENT INVENTION

Slurries and methods for the chemical mechanical polishing (CMP) of copper are described herein. In the following description numerous specific details are set forth to provide an understanding of the embodiments of the present invention. It will be apparent, however, to those skilled in the art and having the benefit of this disclosure, that the embodiments of the present invention may be practiced with apparatuses and processes that vary from those specified here.

Terminology

The terms chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression low k dielectric constant material refers to a material having a dielectric constant lower than the dielectric constant of silicon dioxide and specifically less than around 4.0. In embodiments of this invention the slurry disclosed is of particular use with low k dielectric materials such as SiOF, carbon doped oxide (CDO), porous oxide, and organic materials. Organic dielectric materials include for example organic polymers such as polyamide, parylene, polyarylether, polynaphtalene, or polyquinoline.

Substrate, as used herein, refers to the physical object that is to be planarized by means of the CMP process. A substrate may also be referred to as a wafer. Wafers may be made of semiconducting, non-semiconducting, or combinations of semiconducting and non-semiconducting materials. Silicon wafers including a monocrystalline silicon substrate may have thin films of various materials formed upon them. These thin films may be planarized with CMP processing. Other substrate materials such as GaAs, silicon-on-sapphire, or silicon on insulator (SOI) may be planarized with CMP processing.

Overview

Figure 1A:
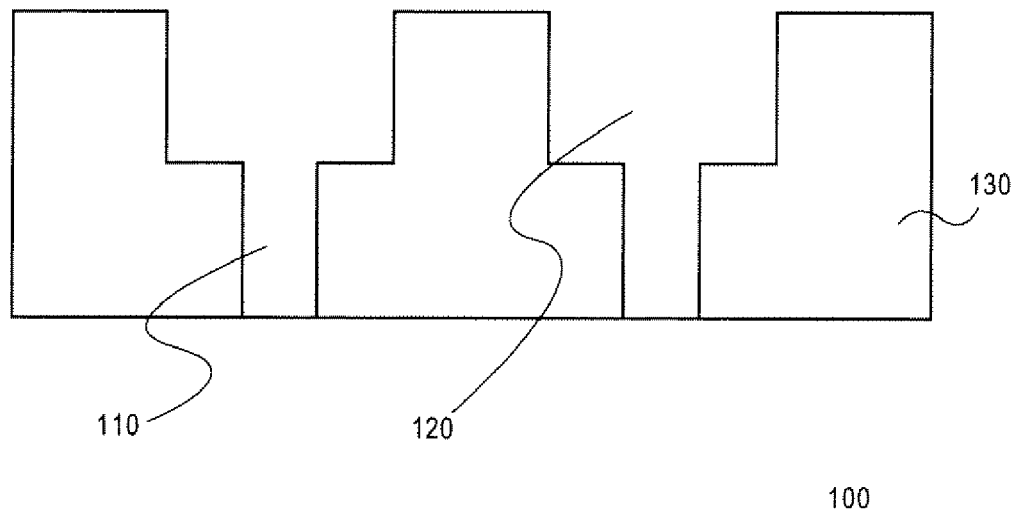
FIG. 1a is an illustration of a cross-sectional view of a dual damascene structure after the dielectric layer has been etched to form both vias and trenches.
Figure 1B:
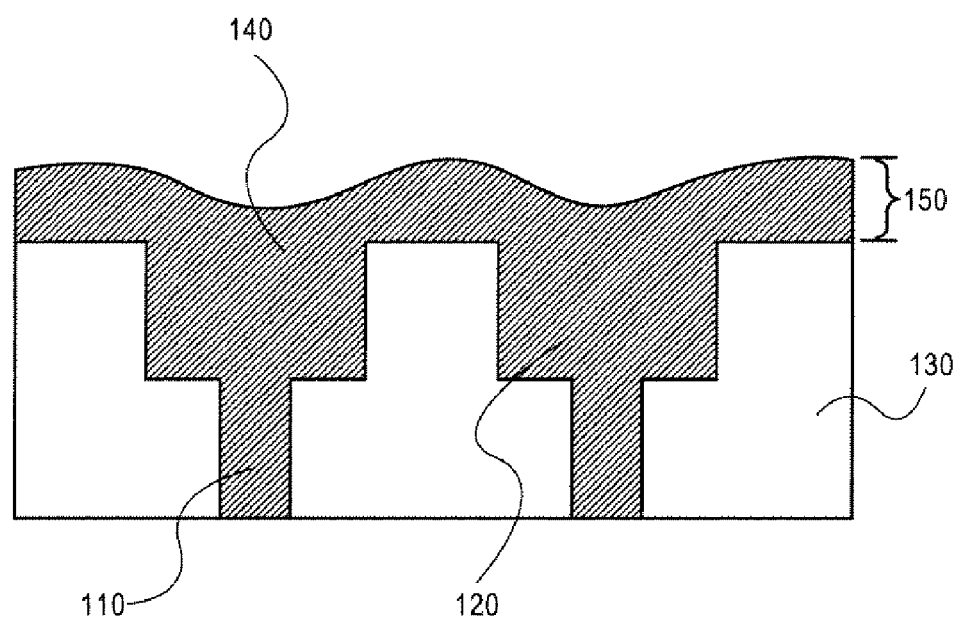
FIG. 1b is an illustration of a cross-sectional view of a dual damascene structure after the vias and trenches have been filled with a copper layer.
Figure 1C:
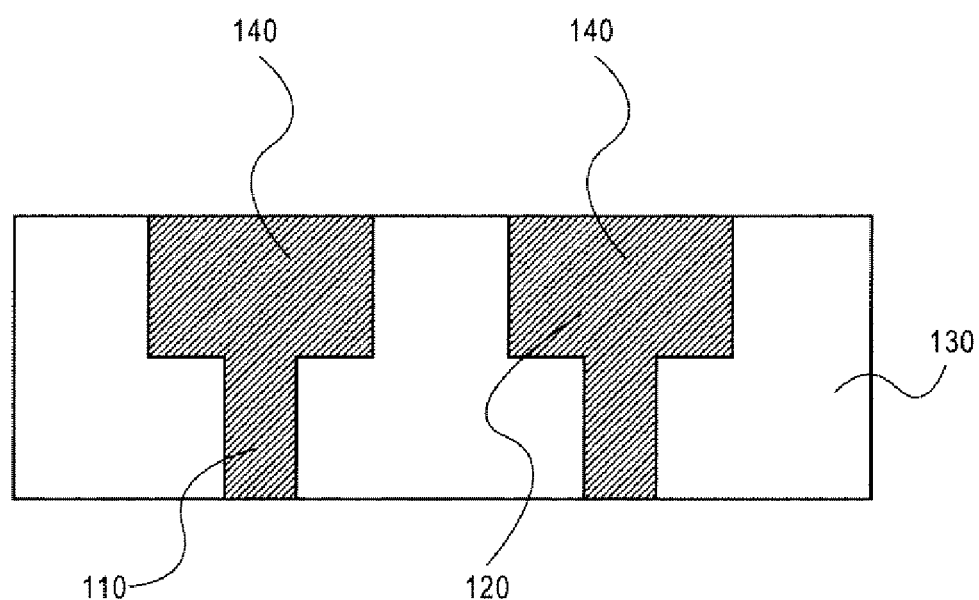
FIG. 1c is an illustration of a cross-sectional view of a dual damascene structure after the copper layer has been polished.

Copper interconnect lines are formed by way of a damascene, or inlaid, metal process. Typically a dual damascene process is used to form both vias and trenches in a single layer. FIG. 1a illustrates a dual damascene structure 100 after vias 110 and trenches 120 have already been etched into dielectric layer 130. FIG. 1b illustrates the dual damascene structure after the vias 110 and trenches 120 have been filled with copper 140. The excess copper layer 150 is then polished using chemical mechanical polishing (CMP), resulting in the planarized dual damascene structure illustrated in FIG. 1c. CMP is a polishing process where a polishing pad exerts pressure and friction on a substrate onto which a slurry has been dispensed. A slurry will typically contain components such as abrasives, anti-corrosives, buffers, and surfactants. The polishing pad is the mechanical part of the polishing and the slurry is the chemical part of the polishing.

Figure 2A:
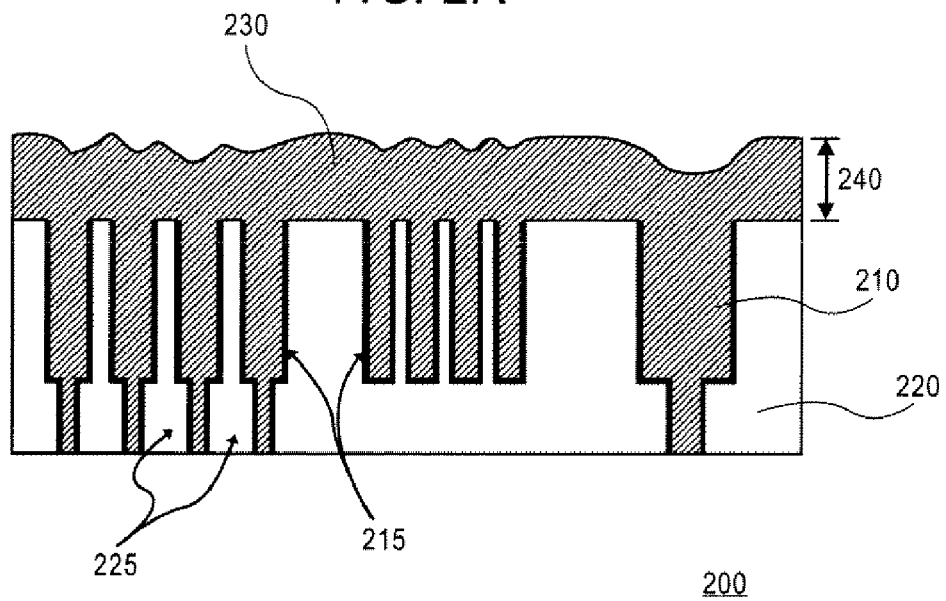
FIG. 2a is an illustration of a cross-sectional view of a copper damascene structure. This structure represents a post-plating, pre-polishing state of fabrication.

In embodiments of the current invention the substrate that will be polished by CMP is a high density interconnect structure 200 such as the one illustrated in FIG. 2a. Referring to FIG. 2a, an illustrative method of forming a high density interconnect structure includes forming a copper diffusion barrier layer 210 over an interlayer dielectric (ILD) 220 patterned to have trenches 215 and vias 225. The barrier layer typically is tantalum, a tantalum based material such as tantalum nitride, or a multilayer Ta-based film. Alternate barrier layers such as Ti, TiN, W, or WN may be used. If an electroplate process is used, a copper seed layer is then formed over the copper diffusion barrier layer 210. Subsequently, a copper layer 230 is electroplated over the seed layer. Alternately, in other embodiments, copper may be deposited in a one-step vapor deposition process. The excess portion of the copper layer 240 is then removed by chemical mechanical polishing (CMP) using a slurry to form the structure illustrated in FIG. 2b.

Figure 2B:
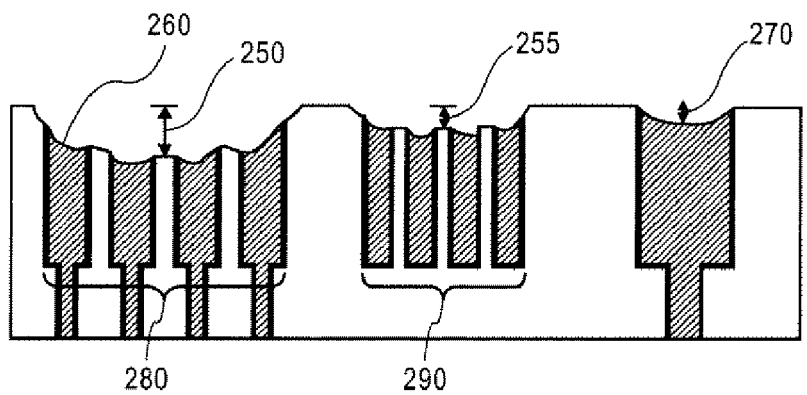
FIG. 2b is an illustration of a cross-sectional view of the copper damascene structure of FIG. 2a after a conventional chemical mechanical polishing.

During the removal of the excess portion of the copper layer 240 two undesirable effects often occur, erosion and dishing of the patterned structures. Erosion occurs in a patterned copper/dielectric layer when the excess portion of the copper layer 240 is overpolished and a portion of the dielectric layer is removed from within the patterned copper/dielectric layer. Erosion is defined here as a thickness, or distance, and more particularly, it is a measure of the distance between the field area (the area outside of the patterned area) of the dielectric layer and its post-polish surface. Examples of erosion are illustrated in FIG. 2b as 250 and 255. Erosion is due to the mechanical polishing of the substrate. The dielectric loss in the field area can also correspond to an additional copper loss within an erosion or dishing structure. This is referred to as global oxide loss. Because the slurries of this application tend to result in relatively low global oxide loss, further discussion is focused on dishing and erosion.

Dishing also occurs when the excess portion of the copper layer 240 is overpolished. Dishing results when a portion of the copper from inside the trenches is removed, leaving a parabolic or concave shaped metal surface such as those of the metal lines 260 and 270 in FIG. 2b. Dishing is due to a mechanical interaction as the polish pad bends into the trenches of the damascene structure. The asperities (rough portions) of the pad push the abrasive particle into the copper surface, inducing a copper loss. Dishing can be reduced by increasing the stiffness of the pad and by decreasing the size of the asperities of the pad, along with a decrease in the size of the slurry particles. Dishing is measured as a thickness, or distance, and more particularly, it is a measure of the distance between the post-polish surface of the interlayer dielectric and the post-polish surface of the metal. On narrow metal lines, where pad bending is negligible, the dishing that is measured is due to a chemical interaction and is more specifically termed a recess. It is to be understood that the further discussion of dishing includes components due to both pad related dishing and chemical related recessing.

Both erosion and dishing are particularly pronounced in high density interconnect structures where the copper density is high relative to the dielectric density. High density interconnects are those where copper is greater than 50% of the surface area. High density areas are illustrated as 280 and 290 in FIG. 2b. The loss of dielectric due to erosion and the loss of copper due to dishing are directly dependent on the pattern density and copper line width. The higher the density of the copper interconnects, the greater the erosion of the ILD and the dishing of the copper. Dishing will be even greater when the copper lines are wide. The dramatic effects of dishing 260 and erosion 250 in combination in high density interconnects can be seen in FIG. 2b on the high density interconnect area 280.

Erosion is even more exaggerated when the dielectric material used for high density interconnect structures has a low dielectric constant (k) of approximately 4.0 or lower. Low k dielectric materials are very soft and porous and are therefore more prone to erosion. Examples of dielectrics that are typically used include $SiO_2$, SiOF, CDO and low k polymer. Dishing can be worse when a low k dielectric is used because the polishing pads can press deeper down into the metal lines due to erosion of the dielectric layer at the edges of wide trenches.

Figure 3:
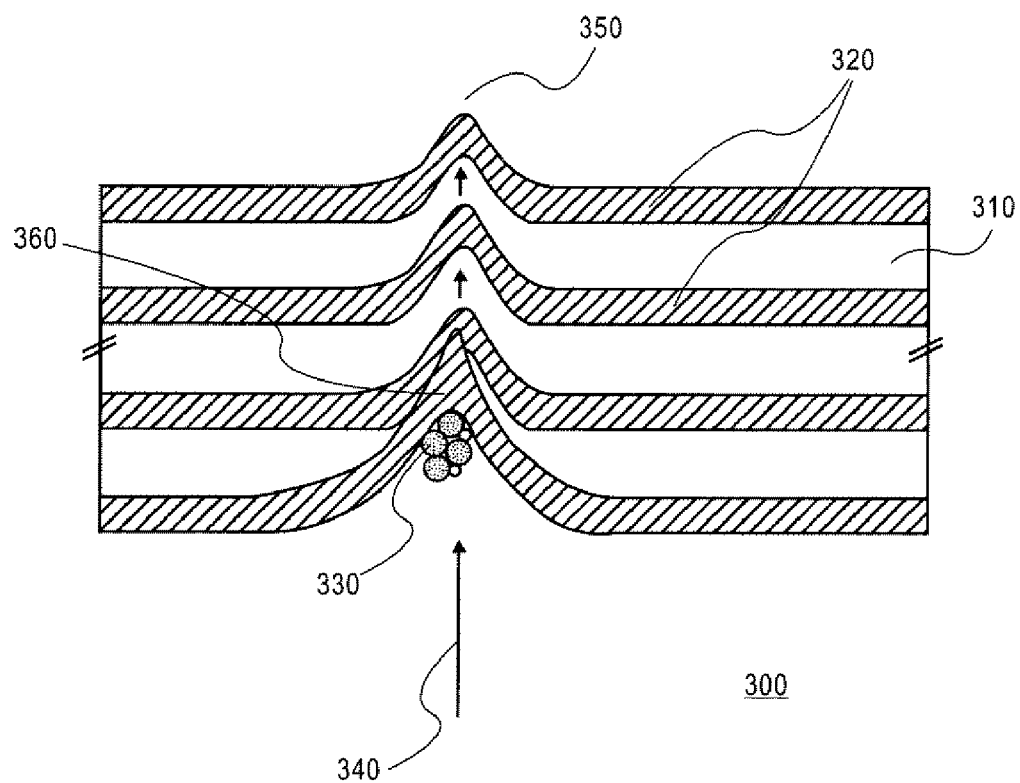
FIG. 3 is an illustration of an overhead view of a copper damascene structure. This structure represents a bent-line defect in a high density area of copper lines.

A problem unique to high density interconnects made with low k dielectric materials is bent line defects. Bent line defects are caused by the impact of a hard and large (~1.0 µm) particle with high density copper interconnect structures made with soft low k dielectric materials. These structures are very soft, so that when a very hard and large particle hits them, the impact of the particle will cause an indentation that will deform the copper lines. This deformation of the copper lines is called a "bent-line" defect. An example of a bent line defect is shown in FIG. 3. FIG. 3 depicts a top view of a high density interconnect structure 300 having a low k dielectric 310 and copper lines 320. Particle 330 has impacted the structure 300 from the direction of the arrow 340. The bent line defects 350 will ripple through the line structure due to the force of the impact of the particle 330. An electrical short 360 will occur when a bent copper line runs into another copper line. Bent line defects are caused by particles that are larger (~1.0 µm) and harder than the abrasives ordinarily present in a slurry. Of particular concern are hard particles that form in a slurry called "aggregates." Aggregates are formed when the silica in a slurry (the abrasive) reacts with the surfactant in the slurry causing the silica particles to adhere together permanently. An aggregate is illustrated as 330 in FIG. 3.

The problems of erosion, dishing, and bent line defects in high density copper interconnect structures made with low k materials are relatively new and therefore few solutions have been created to deal with them. Slurries addressing the problems of dishing and erosion have been created, but they were not specifically formulated for high density structures in low k materials and do not produce good results when used to polish this type of surface. They cause too much erosion of the dielectric or dishing of the copper lines, and are not effective in preventing bent line defects.

Figure 4:
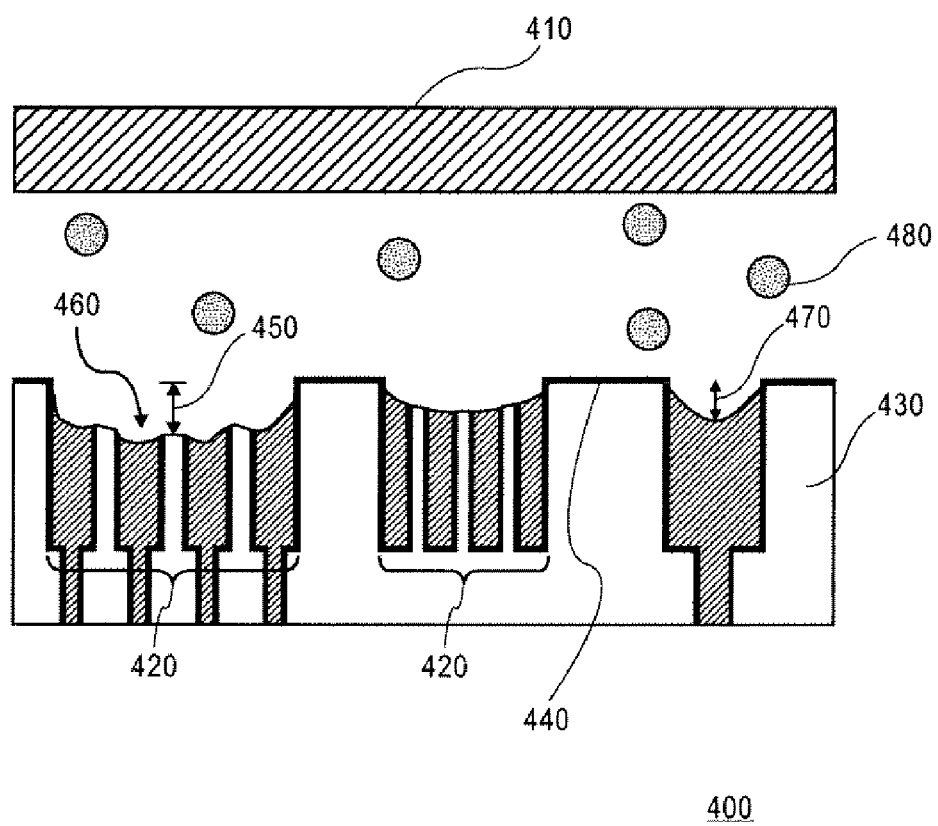
FIG. 4 is an illustration of a cross-sectional view of a copper damascene structure during chemical mechanical polishing using a conventional slurry that stops on a barrier layer.

One such slurry is a slurry of unknown composition that "stops" on tantalum (Ta). FIG. 4 illustrates this slurry on a substrate 400 and under a polishing pad 410. The substrate 400 has high density copper interconnects 420 and a low k dielectric layer 430 and is illustrated as it would look after polishing the excess copper layer. This slurry is selective to tantalum, meaning that it will not polish the tantalum based barrier layer 440. Because the slurry stops on tantalum the dielectric does not become exposed and erosion 450 is reduced. Although this slurry helps prevent erosion, it does not sufficiently help prevent dishing, 460 and 470, and bent line defects. It is known that the abrasive 480 used in this slurry is alumina, a hard material that induces dishing and surface damage such as bent line defects.

Figure 5:
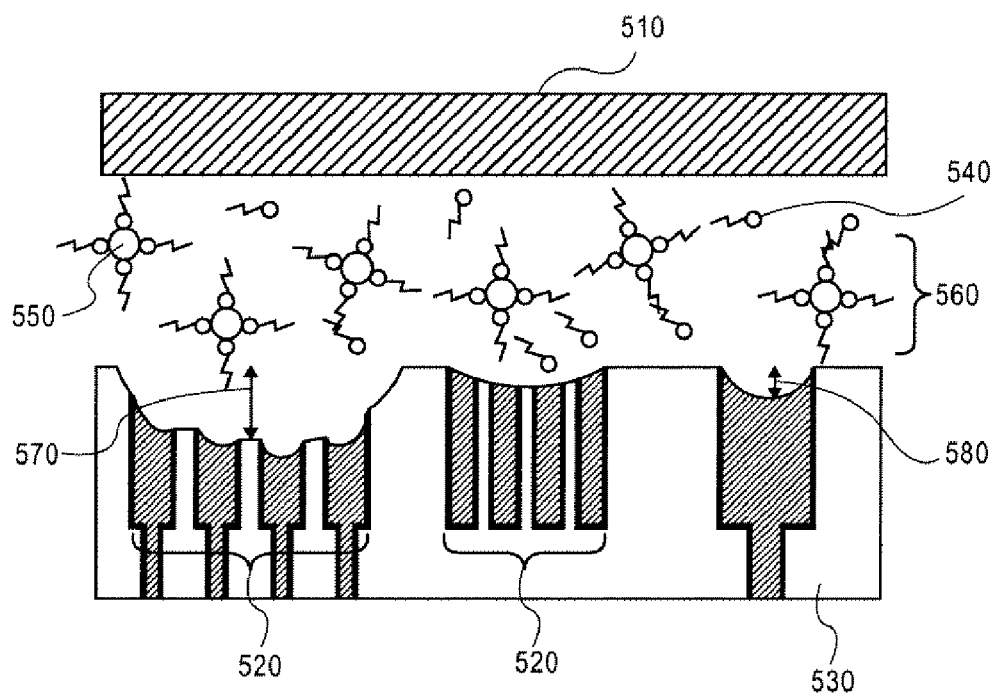
FIG. 5 is an illustration of a cross-sectional view of a copper damascene structure during chemical mechanical polishing using a conventional slurry containing a cationic surfactant.

Another slurry that is used to prevent erosion and dishing contains a cationic (positively charged) surfactant. FIG. 5 illustrates this slurry on a substrate 500 and under a polishing pad 510. The slurry is shown during CMP of a substrate 500 having high density copper interconnects 520 and a low k dielectric layer 530. This slurry contains a cationic surfactant 540 and contains silica 550 as an abrasive instead of alumina. Compared to alumina, silica is a relatively soft abrasive. The problem with the cationic surfactant is that because of its positive charge it interacts with the negatively charged silica abrasive particles to form soft agglomerates. The soft agglomerates are in close proximity to one another and may form large permanent aggregates 560 that cause bent line defects and severe erosion 570 and dishing 580. The formation of these aggregates also uses up most of the surfactant in the slurry so that little of it is left to serve as a lubricant between the slurry and the surface to protect the ILD and the barrier layer from erosion, dishing, and bent line defects.

The Slurry

Figure 6:
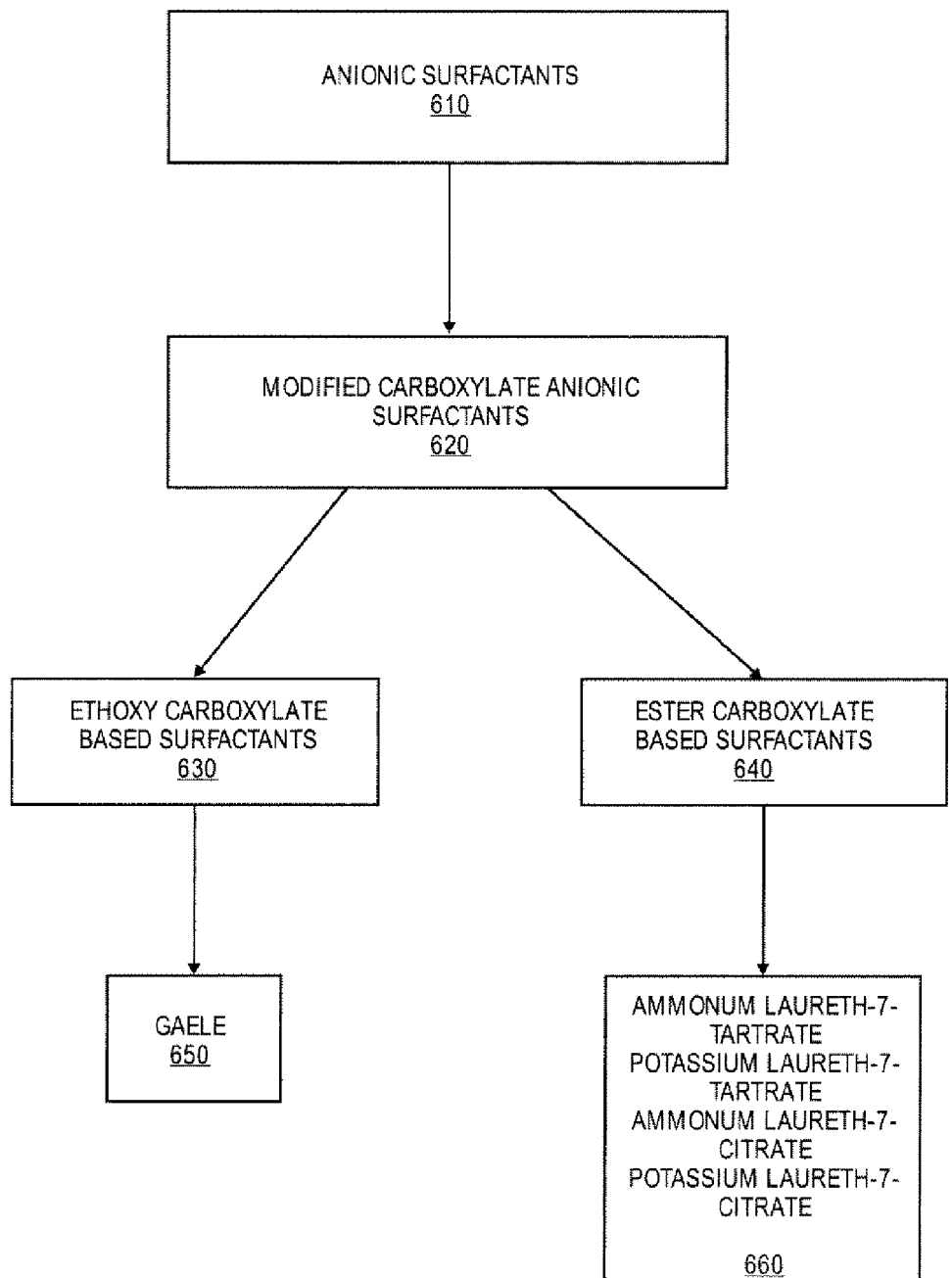
FIG. 6 is a diagram of the surfactants from the most generic description to the most specific.

Slurries, in accordance with embodiments of the present invention, include an anionic (negatively charged) surfactant comprising a modified carboxylate anionic surfactant and an abrasive. The amount of surfactant that is used in the slurry is between 1 g/l and 10 g/l and more preferably between 3 g/l and 6 g/l. The slurry can optionally include an oxidizing agent, a chelating buffer system, and a corrosion inhibitor such as benzotriazole. FIG. 6 is a flow chart illustrating the different groups of anionic surfactants 610 that can be used in embodiments of the present invention. The modified carboxylate anionic surfactants 620 are a specific type of anionic surfactants 610. A chemical compound is anionic if it has an overall negative charge when it undergoes dissociation. This negative charge is present when the surfactant is in solution at or above the pH where the organic acid undergoes dissociation. An advantage of using these anionic surfactants is their low cost. In comparison to other surfactants, and in particular cationic surfactants, they are much less expensive. The modified carboxylate anionic surfactants 620 can be divided into two subgroups, the ethoxy carboxylate surfactants 630 and the ester carboxylate surfactants 640. Ethoxy carboxylate surfactants have the following chemical formula:

$$R-(OCH_2CH_2)_y-O-X$$

Where:

$R=C_nH_{2n+1}$, $(CH_3)_3CC_6H_4$, $C_9H_{19}C_6H_4$, or $CH_3(CH_2)_{n'}$ 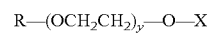$CH=CH(CH_2)_8$ where n=10–18; y=2–20; n'=5–7

X=an organic acid or salt group such as: —$CH_2CO_2R'$, —$CH_2CH_2CO_2R'$, —$CH(CO_2R')(CH_2CO_2R')_2$, or —$CHCH_3CO_2R'$ $R'=NH_4^+$, $K^+$, or $H^+$ Ethoxy carboxylate surfactants are distinguished by their attachment to an organic acid (X) through an ether group (C—O—C). In a preferred embodiment the ethoxy carboxylate surfactant is GAELE, or glycolic acid ethoxylate lauryl ether, as shown at block 650 is used. The chemical formula for GAELE is $CH_3(CH_2)_x(OCH_2CH_2)_yOCH_2CO_2H$, where x=11–13 and y=10.

The ester carboxylate based surfactants 640 have the chemical formula:

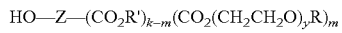

Where R', R, and y are the same as described previously, and k=~1–3 m=~1–2.

Figure 7:
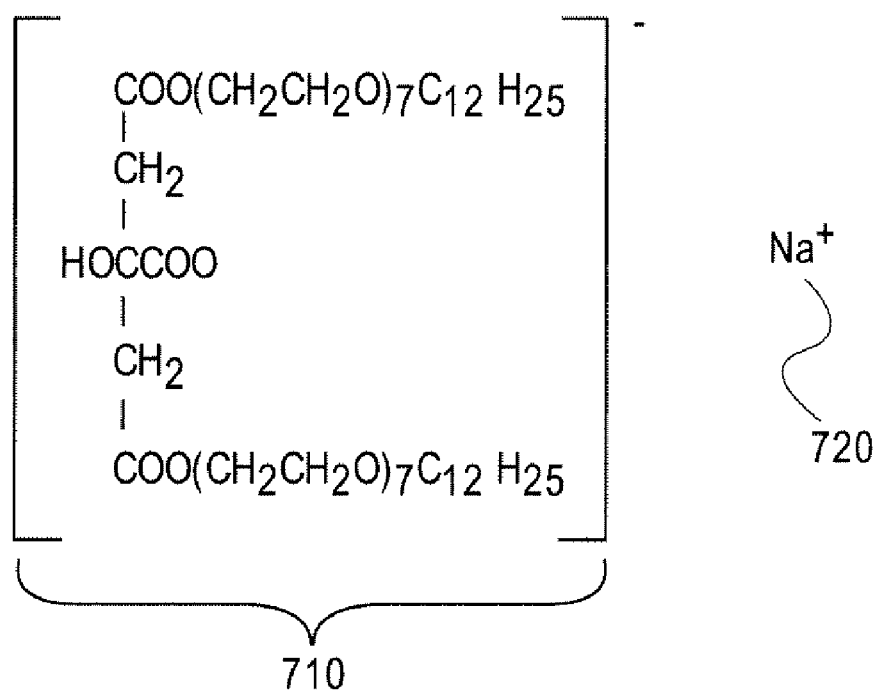
FIG. 7 is a chemical structure of a citrate-based ester carboxylate salt surfactant.

Ester carboxylate surfactants are distinguished by their attachment to an organic acid (X) through an ester group (COOC). Z is an organic chain depending on the starting organic acid. Typically, hydroxy carboxylic acids of the form HO—Z—$(COOH)_k$ are used. Examples of hydroxy carboxylic acids are tartaric acid or citric acid. Specific types of ester carboxylate based surfactants that can be used include ammonium laureth-7-tartrate, potassium laureth-7-tartrate, ammonium laureth-7-citrate, and potassium laureth-7-citrate that are all shown at block 660. An example of a citrate-based ester carboxylate salt surfactant is shown in FIG. 7. The citrate-based ester carboxylate 710 has a negative charge and is complexed to a positively charged sodium ion 720 to form a salt.

Figure 8:
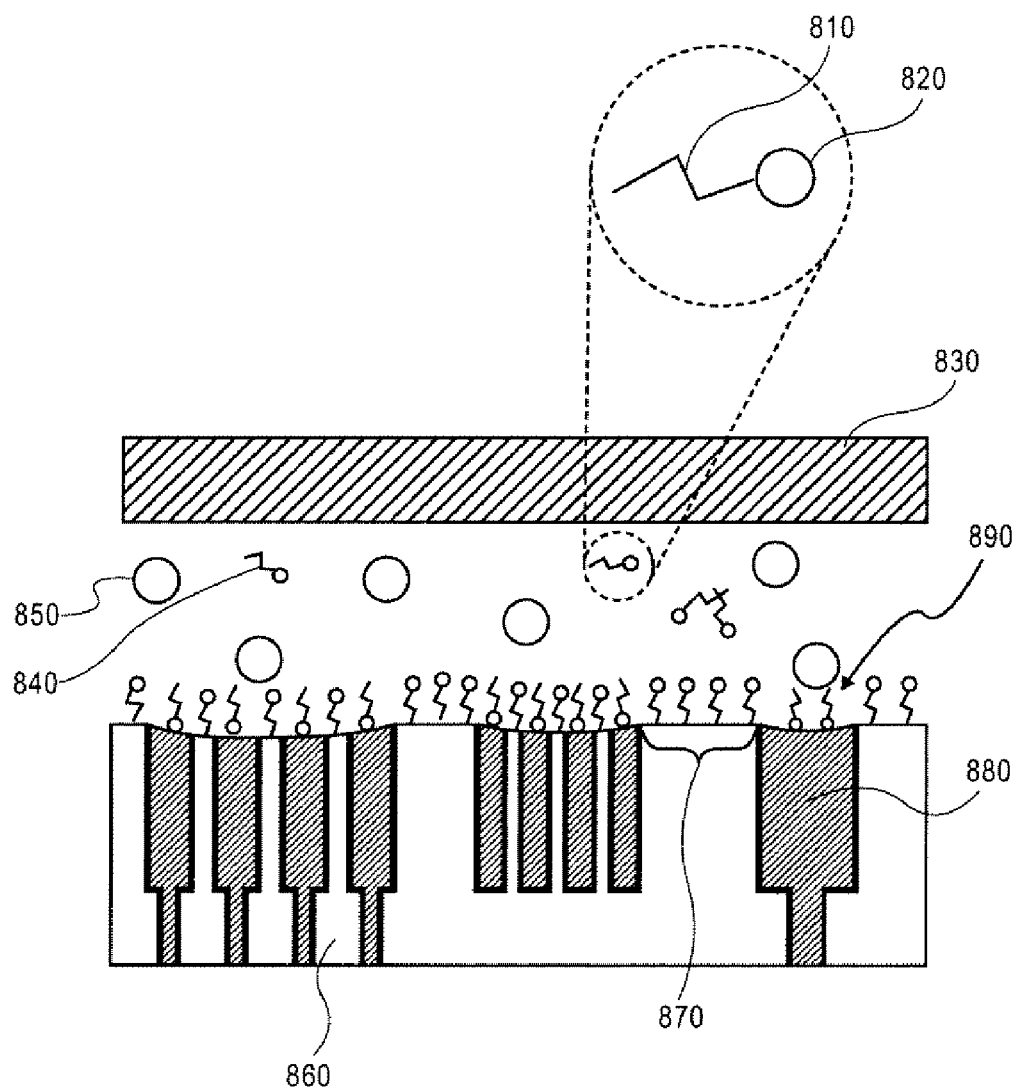
FIG. 8 is an illustration of a cross-sectional view of a copper damascene structure during chemical mechanical polishing using a slurry containing a modified carboxylate anionic surfactant based on an embodiment of the present invention.

These surfactant molecules, as depicted in FIG. 8, are made up of a hydrophobic (water avoiding) tail 810 and a hydrophilic (water loving) head 820 that has a negative charge. The surfactant may be in the form of an organic acid or as a salt with cations such as $Na^+$, $K^+$, or $NH_4^+$. These properties make alkyl ethoxy organic acids ideal for use in a slurry to prevent erosion, dishing, and bent line defects, as well as corrosion. FIG. 8 illustrates an embodiment of a slurry containing modified carboxylate anionic surfactant on a substrate 800 and under a polishing pad 830.

Aggregates that cause bent line defects are minimized in the slurry solution when the anionic surfactants of the present invention are used. This is because the hydrophilic end of the anionic surfactant 840 has an overall negative charge and will therefore not be attracted to the negatively charged silica abrasive particles 850 in the slurry. Aggregates cannot form in this manner because the surfactant and the abrasive are not attracted to one another. Some slight agglomeration of the slurry is observed indicating an agglomeration is occurring through the ($CH_2CH_2O$) group of the surfactant, but it has an insignificant effect on bent line defects.

Additionally, the surfactant coats most of the surface of the substrate 800 due to its ability to stick to both the copper and the ILD. By coating the ILD substrate surface the surfactant acts as a lubricant and enables the slurry to slide over the surface of the substrate with much less friction, thereby reducing the occurrence of bent lines, erosion of the ILD, and dishing of the copper lines. Also, because the surfactant coats the copper it acts as a corrosion inhibitor.

The surfactant coats the ILD because its hydrophobic tail 810 is attracted to the hydrophobic sites in the hydrophobic carbon doped oxide (CDO) dielectric layer 860 as shown at 870. This would also occur when the ILD is made of organic materials. It has also been found that the surfactant works well with non-carbon based dielectric materials such as SiOF. The surfactant coats the copper because its hydrophilic carboxylate head 820 is attracted to the copper in the copper lines 880 as shown at 890.

The slurry also reduces the polish rate of the ILD and any remaining tantalum from the barrier layer, which serves to protect both the ILD and the tantalum barrier layer. Additionally, the slurry protects the copper layer because the surfactant acts as a corrosion inhibitor, as mentioned above, because the surfactant coats the copper layer. The slurry also prevents the pitting corrosion of copper. Pitting corrosion is corrosion that occurs more in some areas than in others. Typically, pitting corrosion exists in areas of defects on the metal surface, such as impurities or topography changes and is initiated by chemicals such as halides and sulfates. The surfactant prevents pitting corrosion because the surfactant does not contain nor is it complexed to pitting corrosion agents such as halides and sulfates.

As compared to the prior art slurries, a slurry of the present invention has lower erosion and dishing rates and a lower incidence of bent lines. The lower erosion and dishing rates of slurries containing modified carboxylate anionic surfactants, and in particular GAELE, makes the slurry competitive with other slurries on the market. The comparison of the performance of the slurries with and without the alkyl ethoxy organic acid surfactant is shown in Table 1 below.

TABLE 1

|  | Slurry without surfactant - see table 3, Col. 2, for slurry | Slurry with modified carboxylate anionic surfactant (i.e. GAELE) - See table 3, Col. 3, for slurry |
| --- | --- | --- |
| Copper polish rate (Å/min) | 1856 | 1663 |
| Copper loss rate from dishing (Å/min)* | 1605 | 238 |
| Copper loss rate from erosion (Å/min)** | 1637 | 419 |
| Erosion rate of ILD (Å/min)** | 4946 | 724 |

*100 μm wide line
**88% dense 3000 μm wide structure, 6 μm wide Cu line, 0.8 μm ILD
These data were all obtained using a 200 mm wafer in an Westech tool where the IC1000/Suba IV polishing pad was at 2.5 psi, 40 rpm, and the slurry flow rate was 180 ccm (cubic centimeters per minute).

In comparison to slurries containing an cationic surfactant, the slurries of the present invention containing a modified carboxylate anionic surfactant demonstrate improved bent line defects and ILD erosion rates, as can be seen in Table II below. The bent line defects are reduced by using a slurry of the present invention containing a modified carboxylate anionic surfactant instead of a cationic surfactant. Improvement in the ILD erosion rate by the slurry of the present invention containing a modified carboxylate anionic surfactant is also shown.

TABLE II

|  | State of the Art Silica Slurry with Cationic Surfactant | Slurry with modified carboxylate anionic surfactant (i.e. GAELE) - See table 3, Col. 3, for slurry |
|---|---|---|
| ILD Erosion Rate (Å/min) | 1825 | 1545 |
| Bent Line Defects (Avg # per wafer) | 9 ± 1.4 | 2 ± 1.4 |
| Copper Relative Friction (g) | 55 | 74 |
| Carbon-Doped-Oxide (CDO) Relative Friction (g) | 76 | 37 |
| SiOF Relative Friction (g) | 68 | 39 |
| Tantalum Relative Friction (g) | 71 | 29 |

The erosion rate data is taken from a 300 mm AMAT reflection tool by polishing at 2 psi, 90 rpm, and 225 ccm of slurry flow for 2 minutes. The pad was an IC1020/SubaIV. The bent line data was obtained by first polishing the patterned copper wafer to remove the bulk of the slurry on platen (polishing table) 1 with a state of the art high rate silica slurry. On platen 2 the polishing pad was an IC1020/SubaIV and the remaining copper along with portions of a tantalum barrier layer were removed under the following two-step conditions: Step (1) the pressure of the pad was 2 psi, the speed of the pad was 90 rpm, and the slurry flow rate was 225 ccm and step (2) the pressure is reduced to 1 psi when the Cu metal starts to be removed.

The abrasive is chosen from silica, or alumina. A preferred embodiment uses silica because it is a relatively soft abrasive that will help prevent bent line defects. The type of silica is preferably precipitated silica having a diameter of around 40 nm, rather than fumed silica. The amount of abrasive added to the slurry is between 0.1 weight percent and 5.0 weight percent, and preferably between 0.5 weight percent and 2.0 weight percent. The oxidizing agent is typically hydrogen peroxide. Around 15 g/l to 400 g/l of 30% hydrogen peroxide would be used in the slurry formulation. The buffer system in a preferred embodiment is a chelating buffer system. A chelating buffer system is a combination of a chelating agent such as the salts of citric acid and a buffer such as an acid/salt of citric acid. In a preferred embodiment the chelating buffer system is a mixture of citric acid and potassium citrate dissolved into the slurry, where the citric acid is between 1 g/l to 8 g/l and the potassium citrate is between 1 g/l and 8 g/l. Other organic complexors or chelating agents include acetic acid, lactic acid, succinic acid, and ascorbic acid. The slurry has a pH between 2 and 12, and preferably between 2 and 6. Alternative inventive slurries may be formed by further combining the above with a corrosion inhibitor such as benzotriazole where benzotriazole is present in the range of between 1 g/l and 8 g/l.

The components of the slurry may be partially or completely pre-mixed before they are dispensed on the polishing pad. Alternatively the components may be mixed or diluted on the polishing pad. The components of the slurry may also be combined in different sequences and at different times.

An exemplary slurry in accordance with an embodiment of the present invention contains at least the anionic surfactant GAELE, the abrasive silica, the oxidizing agent hydrogen peroxide, and the chelating buffer system citric acid and potassium citrate, all dissolved in water. The pH of this slurry is approximately 3.6. An exemplary formula for a slurry based on the GAELE surfactant is shown below in Table 3 in column 3. This slurry will polish the copper layer and then stop on the ILD layer after polishing most of the barrier layer and less than 200 Å of the ILD. Exemplary formulas for slurries based on the GAELE surfactant that will stop on the tantalum barrier layer are shown below in Table 3 in Columns 4, 5, 6 and 7. The slurry in Columns 4 and 5 will stop on tantalum primarily because of an increase in the amount of the surfactant and a decrease in the amount of the abrasive. The presence of a barrier layer will further limit the ILD removal rate of the slurries that stop on tantalum (Ta). Such a slurry has a low copper polishing rate. The slurries in Columns 4, 5, 6, and 7 will stop on tantalum primarily because the buffer system has been changed so that the tantalum polishing rate is decreased and the copper polishing rate is increased. This increases the selectivity of the slurry for tantalum while also increasing the polishing rates of the slurry. Exemplary slurry formulae based on the GAELE surfactant are below in Table 3 along with performance data for the respective slurries.

TABLE 3

| Column 1 Components | Column 2 Amounts for Slurry Without Surfactant | Column 3 Amounts for Slurry that Stops on ILD | Column 4 Amounts for Slurry #1 that Stops on Ta | Column 5 Amounts for Slurry #2 that Stops on Ta | Column 6 Amounts for Slurry #3 that Stops on Ta | Column 7 Amounts for Slurry #4 that Stops on Ta |
|---|---|---|---|---|---|---|
| Silica abrasive (vol %) | 0.75 | 0.70 | 0.4 | 0.4 | 0.4 | 0.34 |
| GAELE Surfactant (g/l) | 0 | 3.5 | 5.5 | 5.5 | 5.5 | 5.5 |
| *Citric acid (g/l) | 4.6 | 3.22 | 3.28 | 4.93 | 4.93 | 4.43 |
| *Potassium Citrate (g/l) | 3.7 | 2.59 | 2.68 | 4.02 | 2.68 | 1.74 |
| *Benzotriazole (g/l) | 3.05 | 3.97 | 3.71 | 3.71 | 3.71 | 3.71 |
| 30% $H_2O_2$ (g/l) | 112 | 145 | 151 | 151 | 151 | 151 |
| Defoamer (g/l) | 0 | 0.25 | 0.25 | 0.25 | 0.25 | 0.25 |
| Copper Polish Rate (Å/min) | 1856 | 1986 | 1752 | 2055 | 3754 | 4418 |

TABLE 3-continued

| Column 1 Components | Column 2 Amounts for Slurry Without Surfactant | Column 3 Amounts for Slurry that Stops on ILD | Column 4 Amounts for Slurry #1 that Stops on Ta | Column 5 Amounts for Slurry #2 that Stops on Ta | Column 6 Amounts for Slurry #3 that Stops on Ta | Column 7 Amounts for Slurry #4 that Stops on Ta |
|---|---|---|---|---|---|---|
| Tantalum Polish Rate (Å/min) | No data available | 89 | 44.2 | 55.4 | 46.5 | 46.1 |
| Selectivity (Cu/Ta) | No data available | 22.3 | 39.6 | 37.1 | 80.7 | 95.8 |
| pH | No data available | 3.6 | 3.5 | 3.5 | 3.1 | 3.1 |

*Based on g/l raw slurry without hydrogen peroxide ($H_2O_2$)

These data were all obtained using a 200 mm wafer in an Westech tool where the IC1000/SubaIV polishing pad was at 2.5 psi, 40 rpm, and the slurry flow rate was 180 ccm (cubic centimeters per minute).

Note: Increasing the copper/tantalum selectivity is possible by increasing surfactant and hydrogen peroxide, and decreasing the abrasive or pH (through a buffer change.)

The components of the slurry may remain in their original chemical form as they existed before they were added to the mixture or they may combine to form chemical compounds or ionic species different from the original components as they existed before they were added to the mixture.

Method

Figure 9:
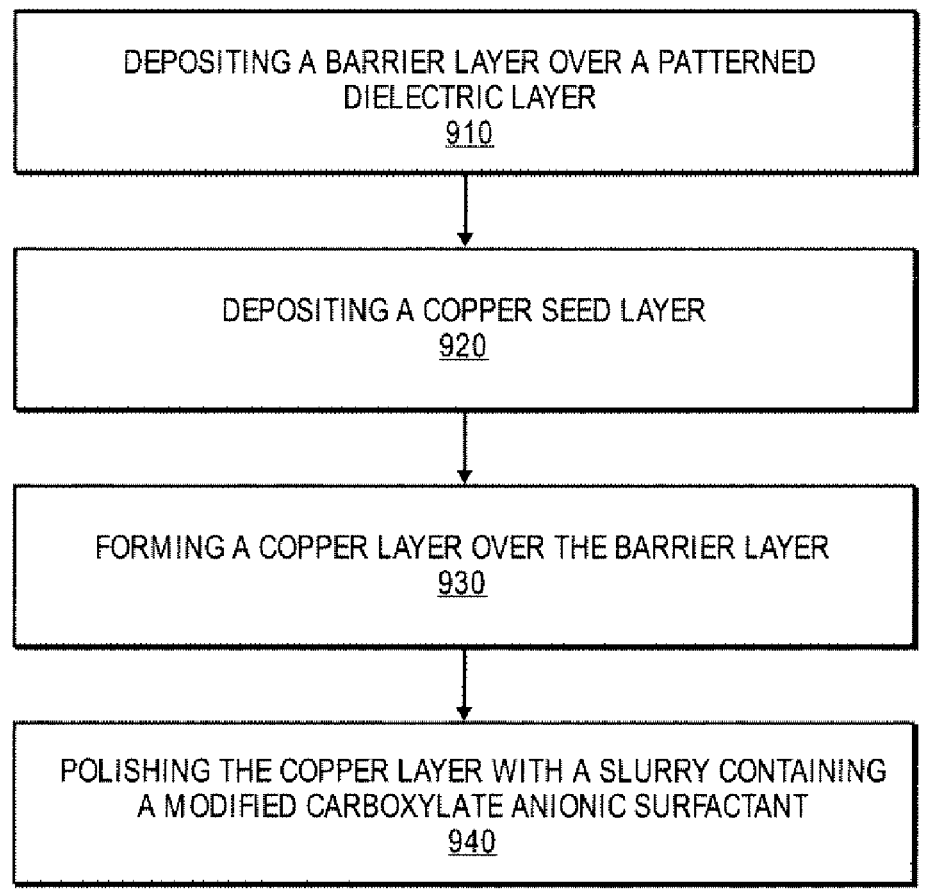
FIG. 9 is a flowchart showing a copper damascene process including polishing in accordance with an embodiment of the present invention.

The slurry presented above is ideally for use in the chemical mechanical polishing (CMP) of high density copper lines in low k dielectric materials formed by a damascene process. In embodiments of the invention the low k dielectric materials are typically $SiO_2$, SiOF, carbon doped oxide (CDO), and low k polymer. Organic low k dielectric materials are also well suited to being polished with the slurry. The density of copper lines is the ratio of the amount of copper to the amount of dielectric material of the substrate. High density copper lines are defined as having a greater than 1:1 ratio of copper to dielectric material. FIG. 9 shows a flow diagram of a method embodying a typical damascene process, employing an embodiment of a slurry of the present invention. At block 910 a barrier layer is deposited over a patterned dielectric layer. Typically the dielectric layer will be patterned to have several trenches, particularly in a structure of high density copper interconnects. The diffusion barrier layer is typically made of tantalum based materials such as tantalum and tantalum nitride. At block 920 a copper seed layer is optionally deposited on the barrier layer. At block 930 a copper layer is deposited over the seed layer to fill the trenches and thus form the copper lines. The copper layer at block 940 is then polished with CMP employing a slurry containing an alkyl ethoxy organic acid surfactant to remove excess copper.

Figure 10:
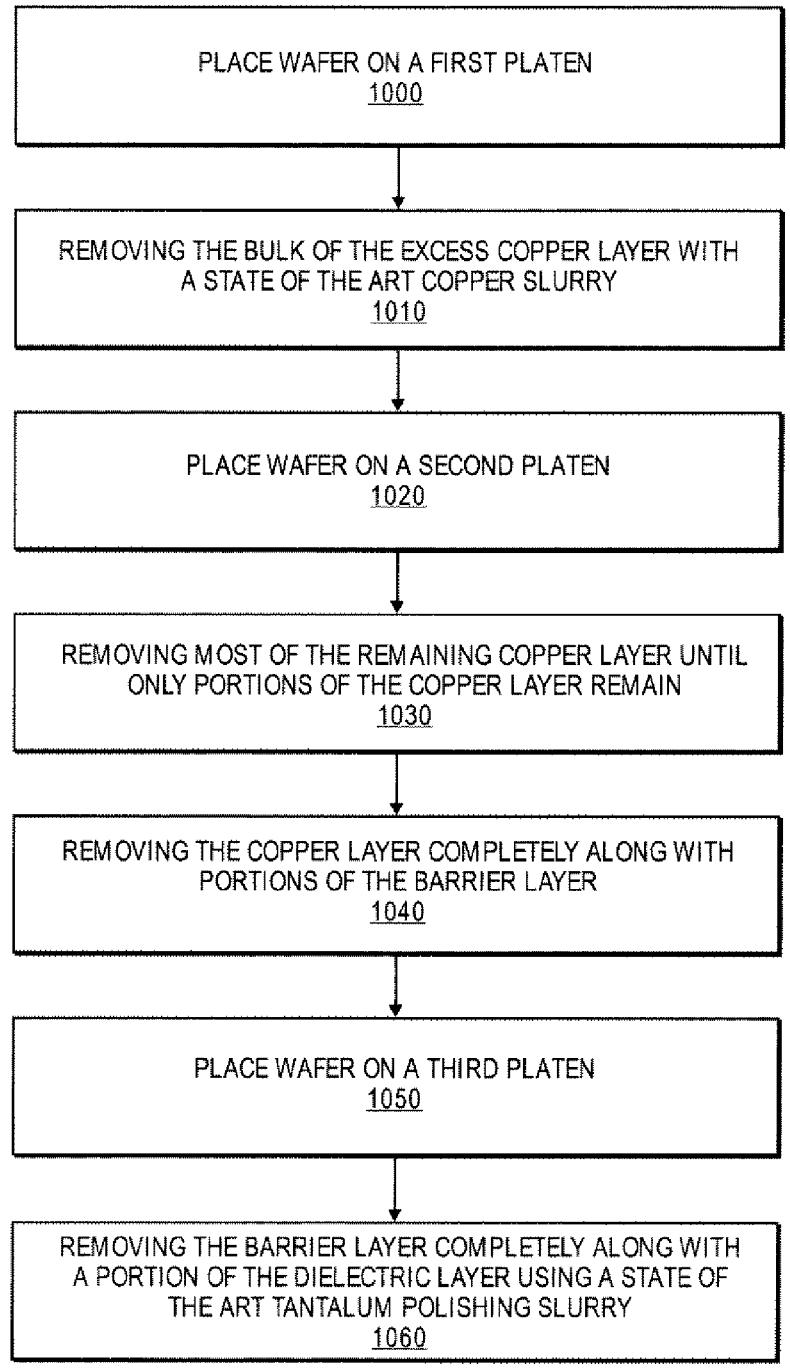
FIG. 10 is a flowchart showing the operations in a process of polishing copper in accordance with an embodiment of the present invention where three platens are used and a slurry in accordance with an embodiment of the present invention that stops on the dielectric layer is used on the second platen.
Figure 11A:
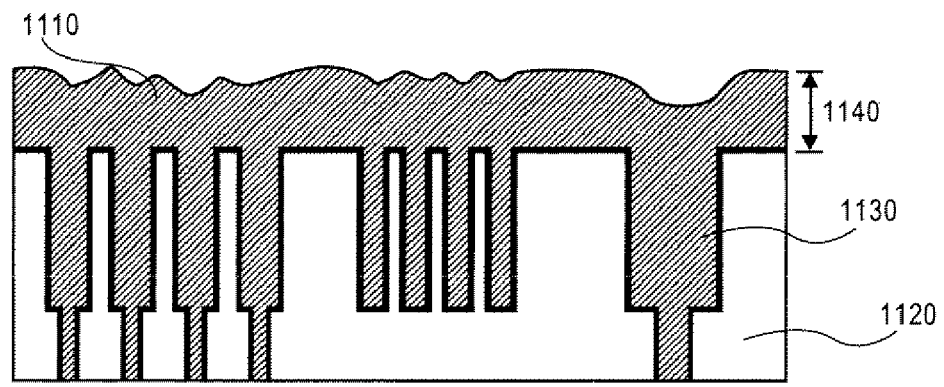
FIGS. 11a–e illustrate cross-sectional views of a copper dual damascene structure at different stages in a process of polishing copper in accordance with an embodiment of the present invention where three platens are used and a slurry in accordance with an embodiment of the present invention that stops on the dielectric layer is used on the second platen.
Figure 11B:
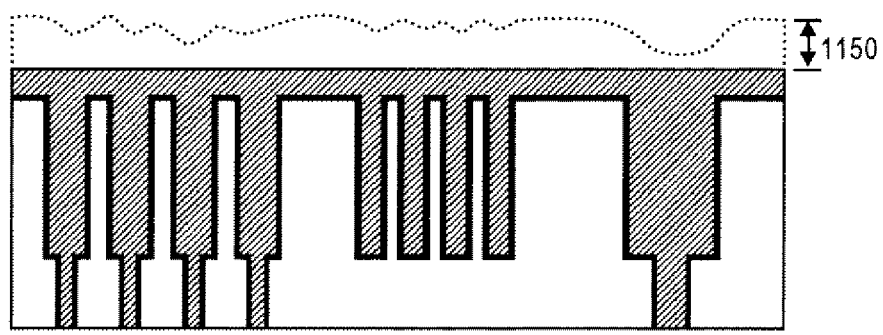
Figure 11C:
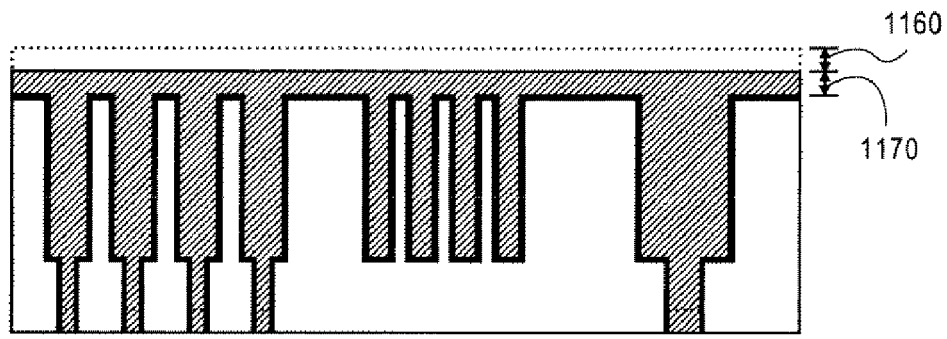
Figure 11D:
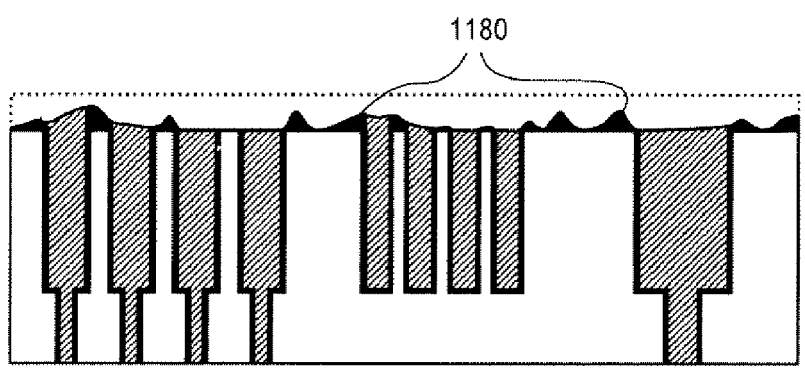
Figure 11E:
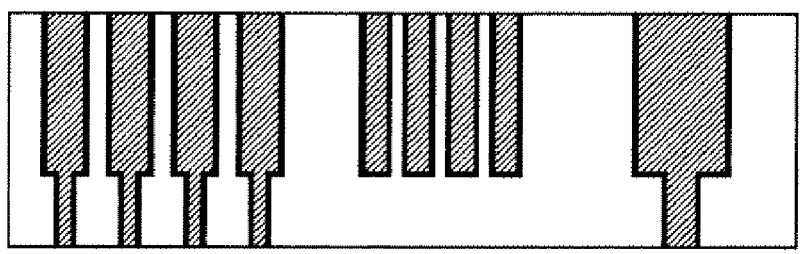

A method of polishing copper with CMP in accordance with the present invention is used to remove the excess copper. FIG. 10 shows a flow diagram of a process embodying a method of the present invention employing a slurry that stops on the ILD (interlayer dielectric) after polishing the copper layer. In this embodiment the polishing process is done with three platens, or polishing stations. As is well known, in a typical CMP system, a wafer is placed face down on a rotating table (also called a platen) covered with a polishing pad, which has been coated with a slurry. A carrier, which may be attached to a rotatable shaft, is used to apply a downward force against the backside of the wafer. A retaining ring may be used to center the wafer onto the carrier and to prevent the wafer from slipping laterally. By applying the downward force, and rotating the wafer, while simultaneously rotating a slurry covered pad, a desired amount of material may be removed from the upper surface of a thin film on the surface of the wafer.

At block 1000 of FIG. 10, the wafer is placed on platen 1. On platen 1, at block 1010, the bulk of the excess copper layer is removed. The excess copper layer is typically between 10,500 Å and 22,500 Å. A bulk layer of around 9000 Å to 20,000 Å, is then removed using a state of the art copper polish slurry. The process is complete when between 1500 Å to 2500 Å of the copper layer remains. The wafer is then transferred to platen 2 at block 1020. The polishing pad at platen 2 is typically a hard pad that rotates at between 60 rpm and 110 rpm, and preferably at 90 rpm. A hard pad is used because it helps minimize dishing and erosion because the pad cannot mechanically bend into the surface as much as a softer pad. One hard pad that can be used is an IC1020 with a SubaIV sub-pad, both made by Rodel, Inc. of 3804 East Watkins Street, Phoenix Ariz. 85034. It is recognized that alternate pads may be used in alternate embodiments. In a preferred embodiment, a slurry formulated to stop on the ILD and containing GAELE is dispensed onto the slurry pad at a rate of between 100 ccm and 300 ccm, and preferably 225 ccm. On platen 2, at block 1030, most of the copper layer is removed until only a portion of the copper remains. To remove most of the copper layer, and leave only a portion of the copper the pad has a pressure of between 1.5 psi and 2.5 psi, and preferably 2.0 psi. At block 1040, while still on platen 2, the copper layer is removed completely along with portions of the barrier layer. The pressure of the pad is decreased, preferrably to 1 psi, to achieve this complete removal of the copper layer. The wafer is then transferred to platen 3 at block 1050. On platen 3 the remaining portions of the barrier layer and part of the ILD layer is removed using a state of the art tantalum slurry at block 1060.

This embodiment of polishing a copper dual damascene structure is illustrated in FIG. 11. A dual damascene structure 11*a* is illustrated after a copper layer 1110 has been deposited over a patterned dielectric layer 1120 and a barrier layer 1130. The thickness of the barrier layer has been exaggerated to more effectively illustrate this method of polishing. The copper layer 1110 has an excess copper layer 1140. A bulk portion 1150 of the excess copper layer 1140, as illustrated in structure 11*b*, is removed at platen 1 using CMP and a state of the art copper removal slurry. The structure is then moved to platen 2 where it is polished with an embodiment of the slurry of the present invention. On platen 2 the copper layer 1160 is first polished until only portions of the copper 1170 remain, as shown at 11c. The remaining portions of copper 1170 are then cleared at platen 2 along with portions of the barrier layer 1130, using the same slurry that will stop on the ILD and contains GAELE, to form the structure 11d. The remaining portions of the barrier layer 1180 are then removed at platen 3 using a state of the art tantalum removal slurry to form the planarized structure 11e.

Figure 12:
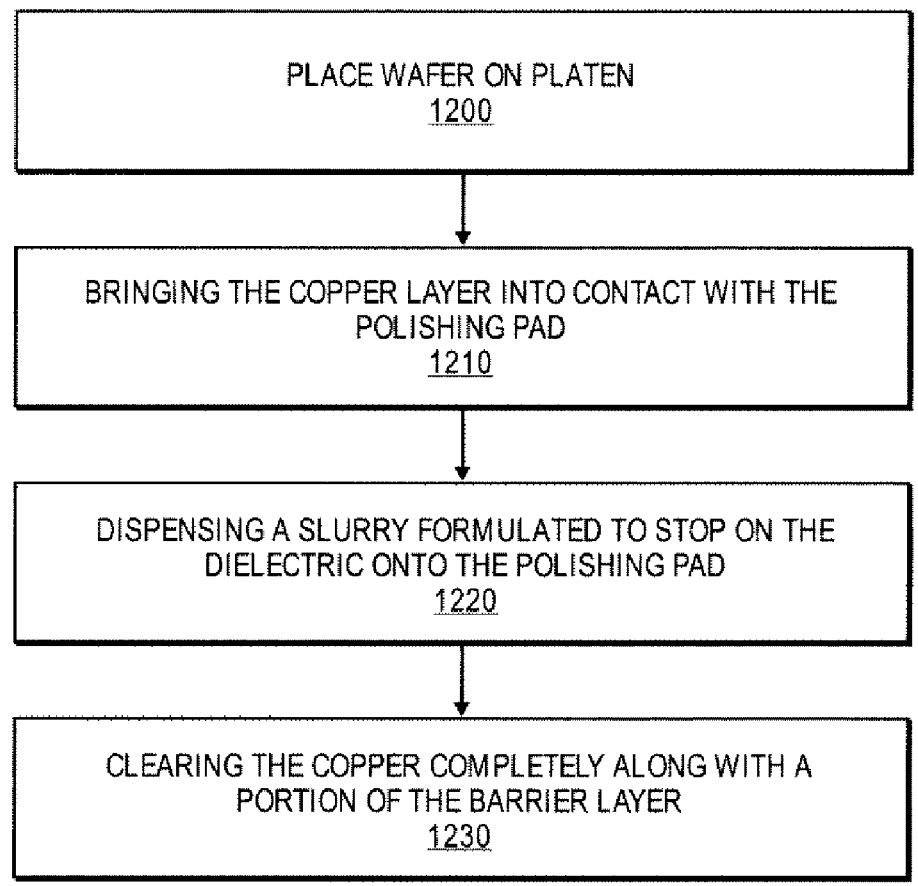
FIG. 12 is a flowchart showing the operations in a process of polishing copper in accordance with an embodiment of the present invention where one platen and one slurry in accordance with an embodiment of the present invention that stops on the dielectric layer is used to clear the copper layer completely along with a portion of the barrier layer.

It is recognized that the above method employing three platens to polish a copper interconnect structure can be simplified to a method employing only one platen. A single polishing pad and slurry are therefore used. In an alternate embodiment, as depicted in the flow chart of FIG. 12, a single platen method may be used. At block 1200 of FIG. 12 the wafer is placed in a platen. At block 1210 the copper layer is brought into contact with a polishing pad (such as an IC1020/SubaIV) having a pressure of between 1.5 psi and 2.5 psi, and preferably 2.0 psi, a speed of between 60 rpm and 110 rpm, and preferably at 90 rpm. Next, at block 1220 a slurry that will stop on the ILD and contains GAELE, is dispensed onto the polishing pad at a rate of between 100 ccm and 300 ccm, and preferably 225 ccm. The excess copper layer is then polished at block 1230 until the copper is completely cleared along with portions of the barrier layer. Following this, at block 960, any remaining portions of the barrier layer are removed using a state of the art tantalum removal slurry and parameters.

Figure 13:
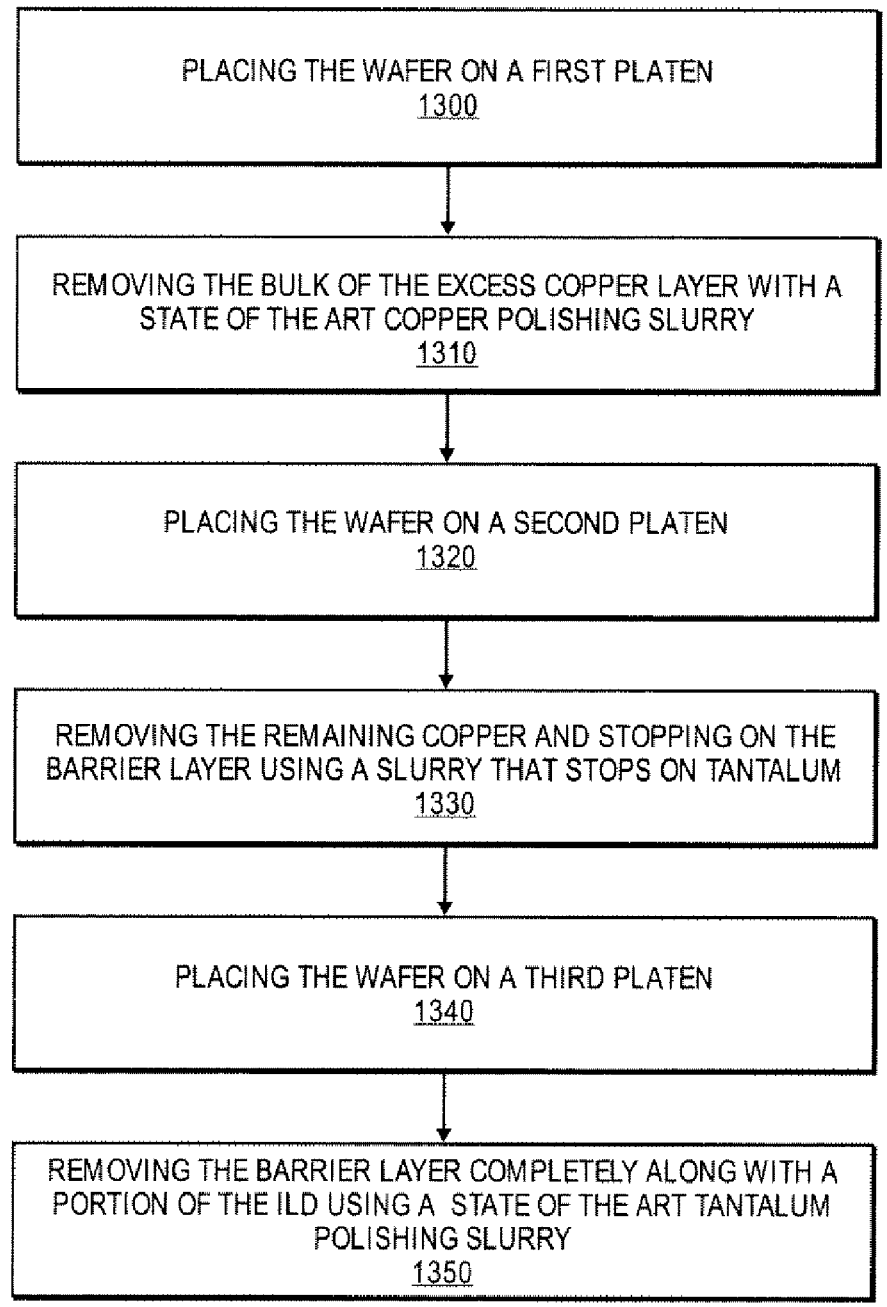
FIG. 13 is a flowchart showing the operations in a process of polishing copper in accordance with an embodiment of the present invention where three platens are used and on the second platen the copper is polished using a slurry of an embodiment of the current invention that stops on tantalum.
Figure 14A:
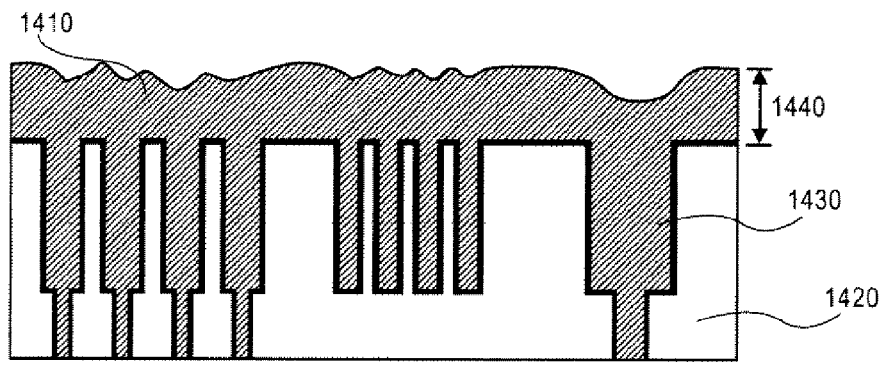
FIGS. 14a–d illustrate cross-sectional views of a copper dual damascene structure at different stages in a process of polishing copper in accordance with an embodiment of the present invention where the excess copper layer is cleared to the barrier layer using a slurry of an embodiment of the current invention that stops on tantalum.
Figure 14B:
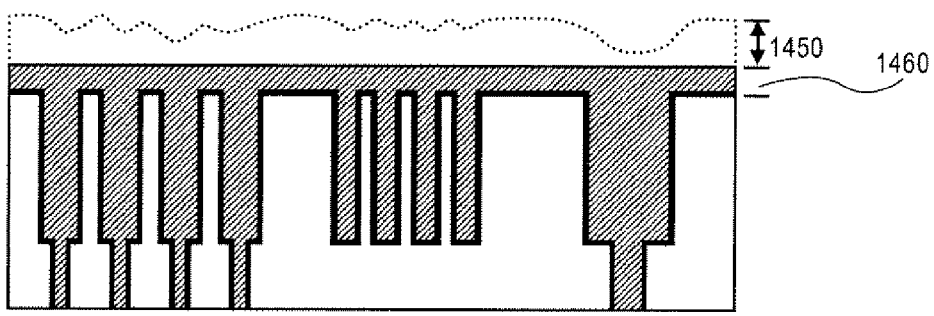
Figure 14C:
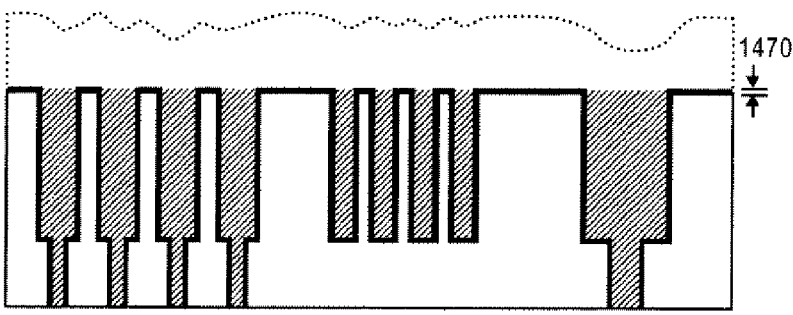
Figure 14D:
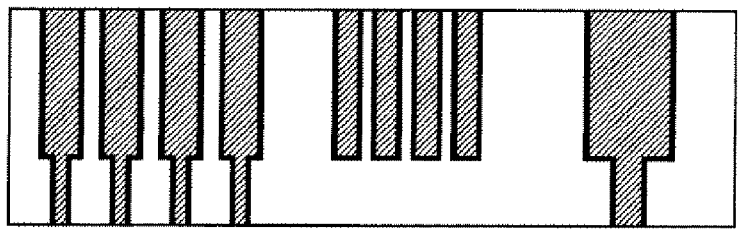

In an alternate embodiment, a slurry of the present invention is formulated to stop on the barrier layer (tantalum) instead of on the ILD after polishing the copper layer. FIG. 13 shows a flow diagram where this method is employed. At block 1300 the wafer is placed on platen 1. On platen 1 the bulk of the excess copper layer is removed with a state of the art copper polish slurry, at block 1310. Typically around 9000 Å to 20,000 Å of copper is removed. The process is complete when between 1500 Å to 2500 Å of the copper layer remains. The wafer is then placed on platen 2 at block 1320 where the remaining copper is removed and the slurry stops polishing on the barrier layer at block 1330. In a preferred embodiment the pad is an IC1020/SubaIV and has a pressure of between 1.5 psi and 2.5 psi and a platen rotation speed of between 60 rpm and 110 rpm. The slurry has a flow rate of between 100 ccm and 300 ccm. This is done using an embodiment of a slurry that stops on tantalum according to the present invention. Four such slurry formulations are presented in Table 3. The wafer is then placed on platen 3 at block 1340. On platen 3 the barrier layer is removed along with a portion of the ILD using a state of the art tantalum slurry at block 1350.

This method is illustrated in FIG. 14. A dual damascene structure 14a is illustrated after a copper layer 1410 has been deposited over a patterned dielectric layer 1420 and a barrier layer 1430. The thickness of the barrier layer has been exaggerated to more effectively illustrate this method of polishing. The copper layer 1410 has an excess copper layer 1440. A bulk portion 1450 of the excess copper layer 1440, as illustrated in structure 14b, is removed at platen 1 using CMP and a state of the art copper removal slurry. The structure is then moved to platen 2 where the remaining ILD 1460 is polished with an embodiment of the slurry of the present invention that will stop on tantalum and preferably contains GAELE. On platen 2 the remaining copper layer is polished until completely removed and the barrier layer 1430 is exposed, as shown at 14c. The exposed portion of the barrier layer 1470 is then removed at platen 3, using a state of the art tantalum removal slurry that also removes some of the ILD, to form the planarized structure 14d.

It is recognized that the above method employing three platens to polish a copper interconnect structure can be simplified to a method employing only two platens, or even one. In an alternate embodiment, the removal of the bulk portion of the excess copper layer and the subsequent polish to remove the copper layer completely is performed on one platen with one polishing pad and slurry. In this embodiment the wafer is placed on a first platen where the copper layer is cleared completely and the slurry stops on the tantalum layer. A slurry that stops on tantalum, consistent with an embodiment of the present invention (see table 3 for examples), is used on this first platen. The barrier layer is then removed at a second platen using a state of the art tantalum slurry that will also remove a portion of the ILD.

Typically, the substrate is cleaned following the CMP process. A common cleaning sequence comprises a megasonic dip, a rinse with DI-$H_2O$ (distilled water), a scrubbing with a copper cleaning solution, and a final spin rinse/dry with DI-$H_2O$.

The above processes can be repeated to form more layers of interconnects. A dual damascene process is typically performed.

Conclusion

Embodiments of the present invention provide a slurry containing an alkyl ethoxy organic acid suitable for the chemical mechanical polishing of high density copper interconnects made with low k interlayer dielectric materials. Other embodiments of the present invention provide methods of polishing copper. The slurry is particularly useful for the polishing of high density copper interconnects in a low k dielectric because it will minimize bent line defects, erosion of the dielectric layer, and dishing of the copper layer. The surfactant also acts as a corrosion inhibitor.

It will be apparent to those skilled in the art that a number of variations or modifications may be made to the illustrative embodiments described above. For example, various combinations, component concentration, slurry pH, slurry delivery rate, pad rotation speed, pad temperature, and so on, may be used within the scope of the present invention.

Other modifications from the specifically described apparatus, slurry, and process will be apparent to those skilled in the art and having the benefit of this disclosure. Accordingly, it is intended that all such modifications and alterations be considered as within the spirit and scope of the invention as defined by the subjoined claims.

We claim:

1. A slurry for polishing copper comprising:
    an ester carboxylate based surfactant that includes a hydrophobic tail and a hydrophilic bead that has a negative charge, wherein the ester carboxylate based surfactant is selected from the group consisting of ammonium laureth-7-tartrate, potassium laureth-7-tartrate, ammonium laureth-7-citrate, and potassium laureth-7-citrate; and,
    an abrasive comprising negatively charged silica particles, wherein the ester carboxylate based surfactant is combined with the abrasive comprising negatively charged silica particles so that the hydrophilic head is not attracted to the negatively charged silica particles thus minimizing agglomeration of the silica and prevents bent line defects in a substrate comprising copper and a low k dielectric material when polished with the ester carboxylate based surfactant and the abrasive comprising silica.

2. The slurry of claim 1 further comprising a chelating buffer system.

3. The slurry of claim 2 wherein the chelating buffer system comprises citric acid and potassium citrate dissolved in the mixture.

4. The slurry of claim 1 further comprising a corrosion inhibitor.

5. The slurry of claim 4 wherein the corrosion inhibitor is benzotriazole.

6. The slurry of claim 1 further comprising an oxidizing agent.

7. The slurry of claim 6 wherein the oxidizing agent is hydrogen peroxide.

8. A slurry formed by the process of combining:

a modified carboxylate anionic surfactant comprising an ester carboxylate based surfactant that includes a hydrophobic tail and a hydrophilic head that has a negative charge, wherein the ester carboxylate based surfactant is selected from the group consisting of ammonium laureth-7-tartrate, potassium laureth-7-tartrate, ammonium laureth-7-citrate, and potassium laureth-7-citrate;

an abrasive comprising negatively charged silica particles;

an oxidizing agent;

a corrosion inhibitor;

a chelating buffer system; and water, wherein the ester carboxylate based surfactant is combined with the abrasive comprising the negatively charged silica particles—so that the hydrophilic head is not attracted to the negatively charged silica particles thus minimizing agglomeration of the silica particles and prevents bent line defects in a substrate comprising copper and a low k dielectric material when polished with the ester carboxylate based surfactant and the abrasive comprising silica particles.

9. The slurry of claim 8 wherein the amount of surfactant used is between 1 g/l and 10 g/l.

10. The slurry of claim 8 wherein the amount of surfactant used is between 3 g/l and 6 g/l.

11. The slurry of claim 8 wherein the amount of abrasive used is between 0.1 weight percent and 5.0 weight percent.

12. The slurry of claim 8 wherein the chelating buffer system is a mixture of between 1 g/l to 8 g/l citric acid and between 1 g/l to 8 g/l potassium citrate.

13. The slurry of claim 8 wherein the corrosion inhibitor is benzotriazole and the amount of benzotriazole used is between 1 g/l to 8 g/l.

* * * * *